(12) United States Patent
Lee et al.

(10) Patent No.: US 8,339,796 B2
(45) Date of Patent: Dec. 25, 2012

(54) EMBEDDED PRINTED CIRCUIT BOARD AND METHOD OF MANUFACTURING THE SAME

(75) Inventors: Sang Chul Lee, Gyunggi-do (KR); Jung Soo Byun, Gyunggi-do (KR); Jin Seon Park, Chungcheongnam-do (KR); Doo Hwan Lee, Gyunggi-do (KR)

(73) Assignee: Samsung Electro-Mechanics, Co., Ltd, Suwon, Gyunggi-Do (KR)

( * ) Notice: Subject to any disclaimer, the term of this patent is extended or adjusted under 35 U.S.C. 154(b) by 0 days.

(21) Appl. No.: 12/972,355

(22) Filed: Dec. 17, 2010

(65) Prior Publication Data

US 2012/0075818 A1 Mar. 29, 2012

(30) Foreign Application Priority Data

Sep. 28, 2010 (KR) .................. 10-2010-0093742

(51) Int. Cl.
*H05K 1/18* (2006.01)
(52) U.S. Cl. ........ 361/761; 361/760; 361/762; 361/748; 361/807; 174/260
(58) Field of Classification Search .................. 361/761, 361/760, 762, 748, 807; 174/260
See application file for complete search history.

(56) References Cited

U.S. PATENT DOCUMENTS 6,597,039 B2 * 7/2003 Ohmi et al. .................... 257/347
2007/0178279 A1 * 8/2007 Ogawa et al. ................. 428/137

* cited by examiner

*Primary Examiner* — Yuriy Semenenko
*Assistant Examiner* — Andargie M Aychillhum
(74) *Attorney, Agent, or Firm* — Blakely Sokoloff Taylor & Zafman LLP

(57) ABSTRACT

Disclosed is an embedded printed circuit board, in which electronic devices having different thicknesses can be embedded together, thus achieving highly dense electronic devices, and when electronic devices having considerably different thicknesses are embedded, two electronic devices which are comparatively thinner can be embedded in a perpendicular direction, thus reducing an embedding area and suppressing warping of the printed circuit board, and an insulating member the thickness of which is variably adjusted is interposed between base substrates, so that spaces between the electronic devices are completely filled therewith, thus solving the problem of void defects, resulting in reliable printed circuit boards, and, when a base substrate includes a core made of metal, the printed circuit board can less warp. Also a method of manufacturing the embedded printed circuit board is provided.

4 Claims, 4 Drawing Sheets

EMBEDDED PRINTED CIRCUIT BOARD AND METHOD OF MANUFACTURING THE SAME

CROSS REFERENCE TO RELATED APPLICATION

This application claims the benefit of Korean Patent Application No. 10-2010-0093742, filed Sep. 28, 2010, entitled "Embedded substrate and a method for manufacturing the same", which is hereby incorporated by reference in its entirety into this application.

BACKGROUND OF THE INVENTION

1. Technical Field

The present invention relates to an embedded printed circuit board and a method of manufacturing the same.

2. Description of the Related Art

Alongside the advances being made in the electronics industry, the demand to reduce the size of electronic components is increasing. There is a recent market trend to fabricate electronic products which are light, slim, short and small this trend continues to achieve printed circuit boards (PCBs) that are slim. Accordingly, different types of mounting methods for devices from conventional surface mount techniques are beginning to make their appearance, and attention is being given to the development of PCBs with embedded electronic devices, that is, PCBs having active devices such as an IC (Integrated Circuit) or passive devices such as capacitors mounted inside of them, in order to ensure highly dense components and high reliability.

Conventional methods of embedding electronic devices include embedding an electronic device using a base substrate having a thickness corresponding to a thickness of the embedding electronic device, and, as necessary, building-up base substrates having electronic devices embedded therein, thus forming a multilayered PCB. However, such conventional methods are problematic because the range of the base substrate that can be selected is limited because of a restriction in which the thickness of the base substrate of the PCB should correspond to the thickness of the electronic device. Furthermore, in the case where a plurality of electronic devices is embedded in a single-layer base substrate, the plurality of electronic devices which will be embedded should be selected only from among those having the same thickness or a similar thickness. If two or more electronic devices having different thicknesses are embedded in a single-layer base substrate, a base substrate having a thickness corresponding to the thickest electronic device among them should be used. As such, in order to completely embed a comparatively thin electronic device, the insulating material must be as thick as a difference in thickness between the electronic devices, undesirably causing the problem of void defects in the insulating material and making it difficult to attain reliable PCBs.

SUMMARY OF THE INVENTION

Accordingly, the present invention has been made keeping in mind the problems encountered in the related art and the present invention is intended to provide an embedded PCB, in which a plurality of electronic devices having different thicknesses is able to be embedded in a single-layer base substrate, and also to provide a method of manufacturing the same.

An aspect of the present invention provides an embedded PCB, comprising a first base substrate having a first device embedded therein, a second base substrate having a second device embedded therein, an insulating member formed between one surface of the first base substrate and one surface of the second base substrate, a third device which is embedded to pass through the first base substrate, the second base substrate and the insulating member and is thicker than the first device and the second device, a first copper clad laminate formed on the other surface of the first base substrate and including a first insulating layer and a first outer circuit layer formed on an outer surface of the first insulating layer, and a second copper clad laminate formed on the other surface of the second base substrate and including a second insulating layer and a second outer circuit layer formed on an outer surface of the second insulating layer.

In this aspect, the embedded PCB may further comprise a first via for electrically connecting the first outer circuit layer with the first device, a second via for electrically connecting the second outer circuit layer with the second device, and a third via for electrically connecting the second outer circuit layer with the third device.

In this aspect, the first base substrate and the second base substrate may be formed of a metal layer.

In this aspect, the first base substrate may comprise a first core layer and a first inner circuit layer formed on an outer surface of the first core layer, and the second base substrate may comprise a second core layer and a second inner circuit layer formed on an outer surface of the second core layer.

In this aspect, the first device and the second device may be formed in a line in a direction perpendicular to the insulating member.

Another aspect of the present invention provides a method of manufacturing an embedded PCB, comprising (A) forming a first cavity and a third cavity in a first base substrate, disposing a first device in the first cavity, disposing a third device in the third cavity, and fixing the first device and the third device, (B) forming a second cavity and a fourth cavity that corresponds to the third cavity in a second base substrate, disposing a second device in the second cavity, and fixing the second device, (C) providing an insulating member having a through hole at a position corresponding to the third cavity and the fourth cavity, (D) disposing the first base substrate and the second base substrate so that one surface of the first base substrate and one surface of the second base substrate face each other, interposing an insulating member between one surface of the first base substrate and one surface of the second base substrate, and pressure laminating the first base substrate, the second base substrate and the insulating member together and (E) forming a first copper clad laminate on the other surface of the first base substrate, and forming a second copper clad laminate on the other surface of the second base substrate.

In this aspect, (A) may comprise (A') forming a first cavity and a third cavity in a first base substrate, attaching a first adhesive layer to the other surface of the first base substrate, disposing a first device in the first cavity, and disposing a third device in the third cavity, and fixing the first device and the third device, and (B) may comprise (B') forming a second cavity and a fourth cavity that corresponds to the third cavity in a second base substrate, attaching a second adhesive layer to the other surface of the second base substrate, disposing a second device in the second cavity and fixing the second device, and the method may further comprise (D') removing the first adhesive layer and the second adhesive layer, between (D) and (E).

In this aspect, (D) may further comprise (D') disposing the first base substrate, the second base substrate and the insulating member so that the third device formed in the first base substrate is disposed in the fourth cavity of the second base substrate through the through hole of the insulating member.

In this aspect, (E) may comprise providing a first copper clad laminate comprising a first insulating layer and a first outer circuit layer formed on an outer surface of the first insulating layer, layering the first copper clad laminate on the other surface of the first base substrate, providing a second copper clad laminate comprising a second insulating layer and a second outer circuit layer formed on an outer surface of the second insulating layer, and layering the second copper clad laminate on the other surface of the second base substrate.

In this aspect, the method may further comprise, after (E), (G) forming a first via for electrically connecting the first outer circuit layer with the first device, a second via for electrically connecting the second outer circuit layer with the second device, and a third via for electrically connecting the second outer circuit layer with the third device.

In this aspect, the first base substrate in (A) and the second base substrate in (B) may be formed of a metal layer.

In this aspect, the first base substrate in (A) may comprise a first core layer and a first inner circuit layer formed on an outer surface of the first core layer, and the second base substrate in (B) may comprise a second core layer and a second inner circuit layer formed on an outer surface of the second core layer.

In this aspect, the first device and the second device in (D) may be formed in a line in a direction perpendicular to the insulating member.

BRIEF DESCRIPTION OF THE DRAWINGS

The features and advantages of the present invention will be more clearly understood from the following detailed description taken in conjunction with the accompanying drawings, in which.

DESCRIPTION OF SPECIFIC EMBODIMENTS

Figure 1:
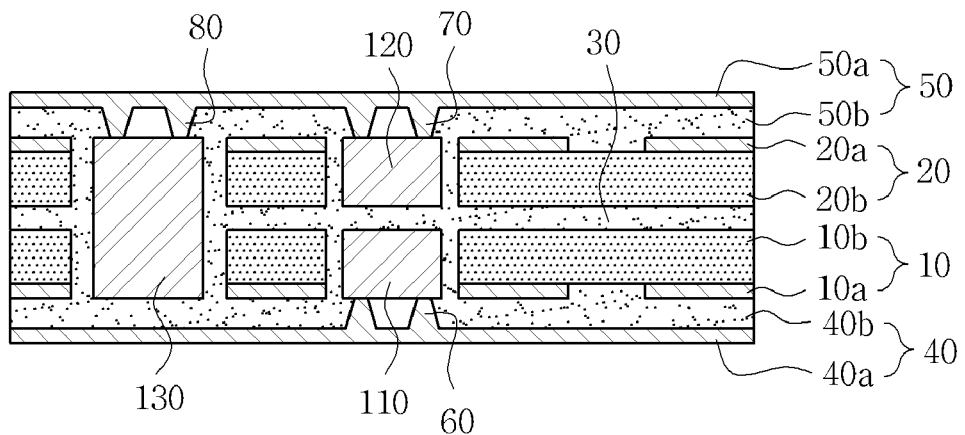
FIGS. 1 and 2 are cross-sectional views showing embedded PCBs according to embodiments of the present invention.

Hereinafter, embodiments of the present invention will be described in detail while referring to the accompanying drawings. Throughout the drawings, the same reference numerals are used to refer to the same or similar elements. Moreover, descriptions of known techniques, even if they are pertinent to the present invention, are regarded as unnecessary and may be omitted when they would make the characteristics of the invention and the description unclear.

Furthermore, the terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept implied by the term to best describe the method he or she knows for carrying out the invention.

Embedded PCB

Figure 2:
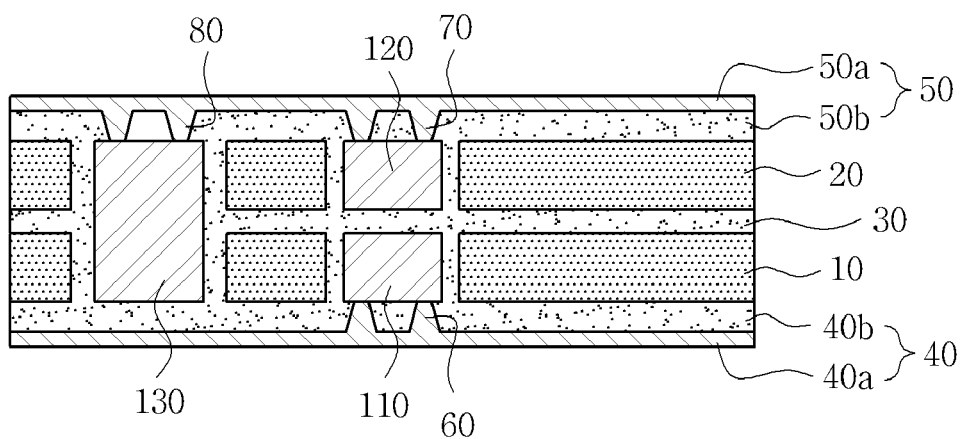

FIGS. 1 and 2 are cross-sectional views showing embedded PCBs according to embodiments of the present invention.

As shown in FIGS. 1 and 2, the embedded PCB according to the present embodiment includes a first base substrate 10 having a first device 110 embedded therein, a second base substrate 20 having a second device 120 embedded therein, an insulating member 30 formed between one surface of the first base substrate 10 and one surface of the second base substrate 20, a third device 130 which is embedded to pass through the first base substrate 10, the second base substrate 20 and the insulating member 30 and is thicker than the first device 110 and the second device 120, a first copper clad laminate 40 formed on the other surface of the first base substrate 10 and including a first insulating layer 40b and a first outer circuit layer 40a formed on the outer surface of the first insulating layer 40b, a second copper clad laminate 50 formed on the other surface of the second base substrate 20 and including a second insulating layer 50b and a second outer circuit layer 50a formed on the outer surface of the second insulating layer 50b, a first via 60 which electrically connects the first outer circuit layer 40a with the first device 110, a second via 70 that electrically connects the second outer circuit layer 50a and the second device 120, and a third via 80 that electrically connects the second outer circuit layer 50a and the third device 130.

The first base substrate 10 includes a first core layer 10b and a first inner circuit layer 10a, and the first inner circuit layer 10a is formed on the outer surface of the first core layer 10b. Specifically, the first inner circuit layer 10a is electrically insulated from the first outer circuit layer 40a by means of the first insulating layer 40b. Also, the second base substrate 20 includes a second core layer 20b and a second inner circuit layer 20a, and the second inner circuit layer 20a is formed on the outer surface of the second core layer 20b. As such, the first core layer 10b and the second core layer 20b may be formed of an insulating material.

On the other hand, the first base substrate 10 and the second base substrate 20 may be formed of a metal layer (FIG. 2). The first base substrate 10 and the second base substrate 20, which are formed of the metal layer, are advantageous because they are more rigid than the first base substrate 10 including the first core layer 10b made of an insulating material and the first inner circuit layer 10a formed on the outer surface of the first core layer 10b and the second base substrate 20 including the second core layer 20b made of an insulating material and the second inner circuit layer 20a formed on the outer surface of the second core layer 20b, and thus the resulting embedded PCB has higher resistance to external stress and can less warp.

The thickness of the insulating member 30, which is formed between one surface of the first base substrate 10 and one surface of the second base substrate 20 and laminated together, may be variably adjusted during the fabrication of the embedded PCB, and such an insulating member 30 is maintained in a semi-cured state before being subsequently cured to manufacture a product. Hence, the insulating member 30 may suffice as the required amount of resin between the base substrates, and also may efficiently charge the empty space between the elements while flowing in the PCB.

The first copper clad laminate 40 and the second copper clad laminate 50 are respectively formed on the outer surfaces of the base substrates, which have the plurality of devices embedded therein and are pressure laminated together. The first copper clad laminate 40 includes the first insulating layer 40b and the first outer circuit layer 40a formed on the outer surface of the first insulating layer 40b, and the second copper clad laminate 50 includes the second insulating layer 50b and the second outer circuit layer 50a formed on the outer surface of the second insulating layer 50b.

The embedded PCB according to the present invention is configured such that the first device 110, the second device 120 and the third device 130 are disposed in the base substrates, in which the first device 110 has the same thickness as that of the first base substrate 10 and the second device 120 has the same thickness as that of the second base substrate 20.

The third device 130 is thicker than the first device 110 and the second device 120. Alternatively, a device which is thicker than the sum of the thicknesses of the first device 110 and the second device 120 may be adopted as the third device 130.

Furthermore, the first device 110 and the second device 120 may be formed in a line in a direction perpendicular to the insulating member 30. In this case, the PCB may be symmetric, and thereby warping of the entire PCB may be suppressed, and the embedding density of electronic devices may be increased.

The vias 60, 70, 80 function to electrically connect the first outer circuit layer 40a or the second outer circuit layer 50a with the first device 110, the second device 120 or the third device 130.

Specifically, the first via 60 which functions to electrically connect the first outer circuit layer 40a with the first device 110 may be formed by disposing a pad of the first device 110 toward the first outer circuit layer 40a, forming a via hole to correspond to the pad and filling the via hole with a conductive metal such as Cu Likewise, the second via 70 functions to electrically connect the second outer circuit layer 50a with the second device 120, and the third via 80 functions to electrically connect the first outer circuit layer 40a or the second outer circuit layer 50a with the third device 130 depending on the direction of a pad of the third device 130.

Method of Manufacturing Embedded PCB

FIGS. 3 to 9 are cross-sectional views showing a process of manufacturing the embedded PCB according to the embodiment of the present invention. With reference thereto, the method of manufacturing the embedded PCB according to the present embodiment is described below.

Figure 3:
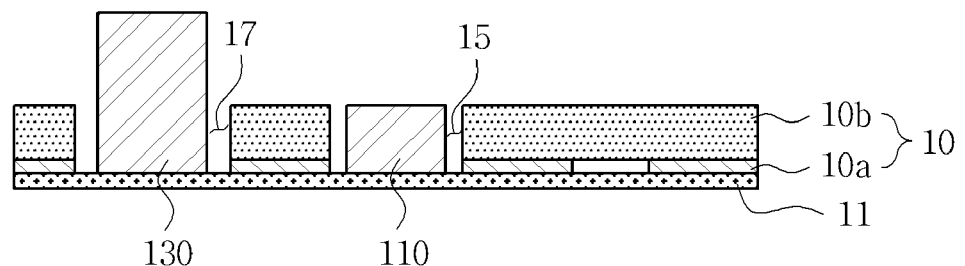
FIGS. 3 to 9 are cross-sectional views showing a process of manufacturing the embedded PCB according to the embodiment of the present invention.

As shown in FIG. 3, a first cavity 15 and a third cavity 17 are formed in a first base substrate 10, and a first adhesive layer 11 is attached to the other surface of the first base substrate 10, after which a first device 110 is disposed in the first cavity 15 and a third device 130 is disposed in the third cavity 17, followed by fixing these devices to the first adhesive layer 11.

In order to manufacture the embedded PCB according to the present embodiment, the first device 110 having the same thickness as that of the first base substrate 10 is embedded in the first base substrate 10. Specifically, as shown in FIG. 3, a first base substrate 10 having the same thickness as that of the first device 110 is prepared. Thereafter, a portion of the first base substrate 10 as large as the size of the first device 110 is perforated so that the first device 110 can be embedded in the first base substrate 10, thus forming the first cavity 15. Furthermore, a portion of the first base substrate 10 as large as the size of the third device 130 is perforated so that the third device 130 which is thicker than the first device 110 can pass through the first base substrate 10, thus forming the third cavity 17. Thereafter, the first adhesive layer 11 is attached to the other surface of the first base substrate 10. As such, the first adhesive layer 11 is temporarily used to fix the first device 110 and the third device 130 to the first base substrate 10.

More specifically, the first device 110 is disposed in the first cavity 15 in such a manner that a pad of the first device 110 is disposed in the direction of being inserted into the first cavity 15 and then inserted (face down), and the first device 110 is then attached to the first adhesive layer 11. As such, the pad of the first device 110 is flush with the other surface of the first base substrate 10, and the lower surface of the first device 110 is flush with one surface of the first base substrate 10. Furthermore, the third device 130 is disposed in the third cavity 17 and then attached to the first adhesive layer 11. As such, because the third device 130 is thicker than the first base substrate 10, when the disposed third device 130 is attached to the first adhesive layer 11, the lower surface of the third device 130 is flush with the other surface of the first base substrate 10, and the pad of the third device 130 may be provided in the form of protruding from one surface of the first base substrate 10.

Figure 4:
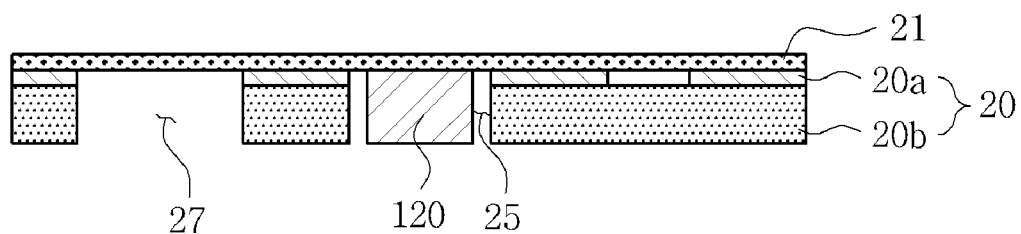

Next, as shown in FIG. 4, a second cavity 25 and a fourth cavity 27 that corresponds to the third cavity 17 are formed in a second base substrate 20, a second adhesive layer 21 is attached to the other surface of the second base substrate 20, and then a second device 120 is disposed in the second cavity 25 and fixed to the second adhesive layer 21. The second base substrate 20 includes a second core layer 20b and a second inner circuit layer 20a, the second inner circuit layer 20a being formed on the outer surface of the second core layer 20b. As such, the second core layer 20b may be made of an insulating material. Specifically, as seen in FIG. 4, a second base substrate 20 having the same thickness as that of the second device 120 is prepared, and a portion of the second base substrate 20 as large as the size of the second device 120 is perforated so that the second device 120 can be embedded in the second base substrate 20, thus forming the second cavity 25. Furthermore, a portion of the second base substrate 20 as large as the size of the third device 130 is perforated so that the third device 130 which is thicker than the first device 110 can pass through the second base substrate 20, thus forming the fourth cavity 27. Thereafter, the second adhesive layer 21 is attached to the other surface of the second base substrate 20. As such, the second adhesive layer 21 is temporarily used to fix the second device 120 to the second base substrate 20.

More specifically, the second device 120 is disposed in the second cavity 25 in such a manner that a pad of the second device 120 is disposed in the direction in which it is inserted into the second cavity 25 and inserted (face up), and then the second device 120 is attached to the second adhesive layer 21. In this case, the pad of the second device 120 is flush with the other surface of the second base substrate 20, and the lower surface of the second device 120 is flush with one surface of the second base substrate 20. The fourth cavity 27 is used to insert the third device 130, which is fixed to and protrudes from the first base substrate 10, in a subsequent process.

Also, the first adhesive layer 11 and the second adhesive layer 21 are used to fix the first device 110, the second device 120, and the third device 130, and do not have to have a layer structure having adhesive force. Furthermore, because these adhesive layers are removed after being used and are not permanent, a typical adhesive such as an adhesive film may be used. Alternatively, the adhesive layers may be omitted as far as the device may be fixed to the base substrate without even using the adhesive.

Figure 5:
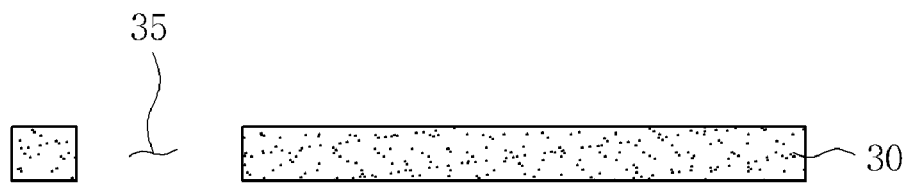

Next, as shown in FIG. 5, an insulating member 30 having a through hole 35 at a position corresponding to the third cavity 17 and the fourth cavity 27 is prepared.

As such, the thickness of the insulating member 30 may be variable. Thus, in the case where the third device 130 is much thicker than the sum of thicknesses of the first device 110 and the second device 120, the thickness of the insulating member 30 may compensate for the difference in thickness between the devices, thus solving the problem of void defects in the PCB.

Taking into consideration the thickness of the first device 110, the second device 120 and the third device 130, the thickness of the insulating member 30 is determined. For instance, the thickness of the insulating member 30 may be set so that the first base substrate 10 and the second base substrate 20 are pressure laminated and then the pad of the third device 130 can be fixed to the first adhesive layer 11 through the second base substrate 20.

The insulating member 30 is maintained in a semi-cured state before being cured in a subsequent process, and thus exhibits superior charging capability and resin flowability, and may be efficiently charged between the first device 110 and the first cavity 15, between the second device 120 and the second cavity 25, or between the third device 130 and the third cavity or the fourth cavity 27.

Figure 6:
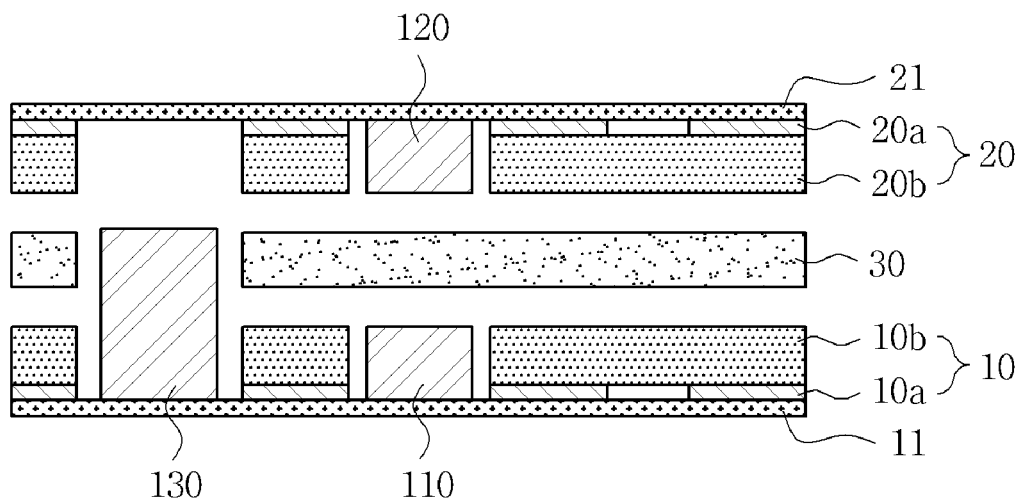

Next, as shown in FIG. 6, the first base substrate 10 and the second base substrate 20 are disposed so that one surface of the first base substrate 10 and one surface of the second base substrate 20 face each other, and the insulating member 30 is interposed between one surface of the first base substrate 10 and one surface of the second base substrate 20.

Specifically, the first base substrate 10, the second base substrate 20 and the insulating member 30 are disposed such that the third device formed in the base substrate 10 is inserted into the fourth cavity of the second base substrate 20 through the through hole 35 of the insulating member 30.

Figure 7:
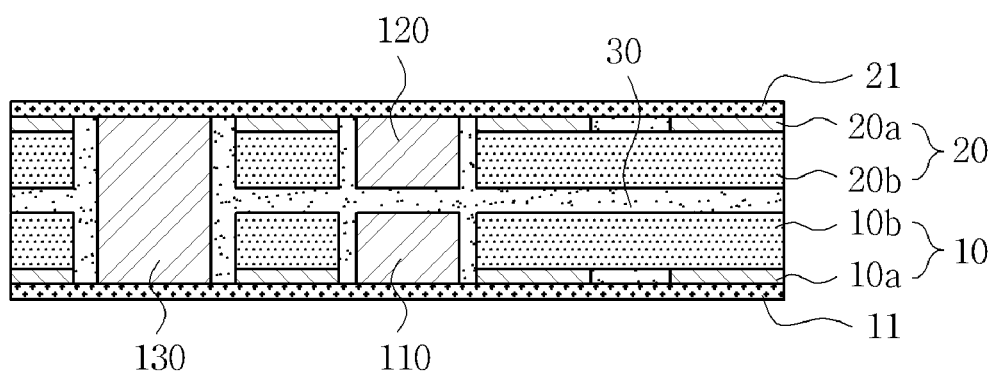

Next, as shown in FIG. 7, the first base substrate 10, the second base substrate 20, and the insulating member 30 are pressure laminated together, and the first adhesive layer 11 and the second adhesive layer 21 are removed. As shown in FIGS. 6 to 9, the first device 110 and the second device 120 may be formed in a line in a direction perpendicular to the insulating member 30.

Figure 8:
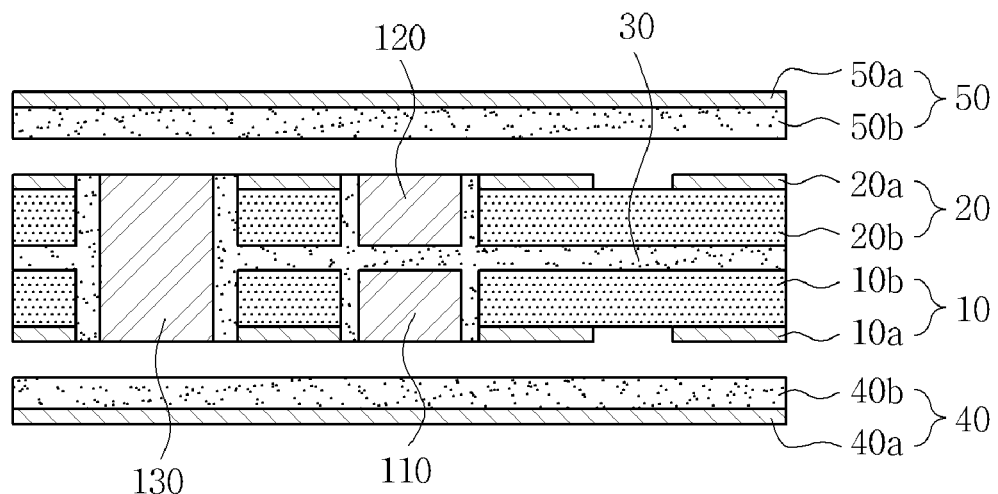

Next, as shown in FIG. 8, a first copper clad laminate 40 is layered on the other surface of the first base substrate 10, and a second copper clad laminate 50 is layered on the other surface of the second base substrate 20.

Specifically, the first copper clad laminate 40 including a first insulating layer 40b and a first outer circuit layer 40a formed on the outer surface of the first insulating layer 40b is prepared, and the first insulating layer 40b is disposed to come into contact with the other surface of the first base substrate 10. Furthermore, the second copper clad laminate 50 including a second insulating layer 50b and a second outer circuit layer 50a formed on the outer surface of the second insulating layer 50b is prepared, and the second insulating layer 50b is disposed to come into contact with the other surface of the second base substrate 20.

Figure 9:
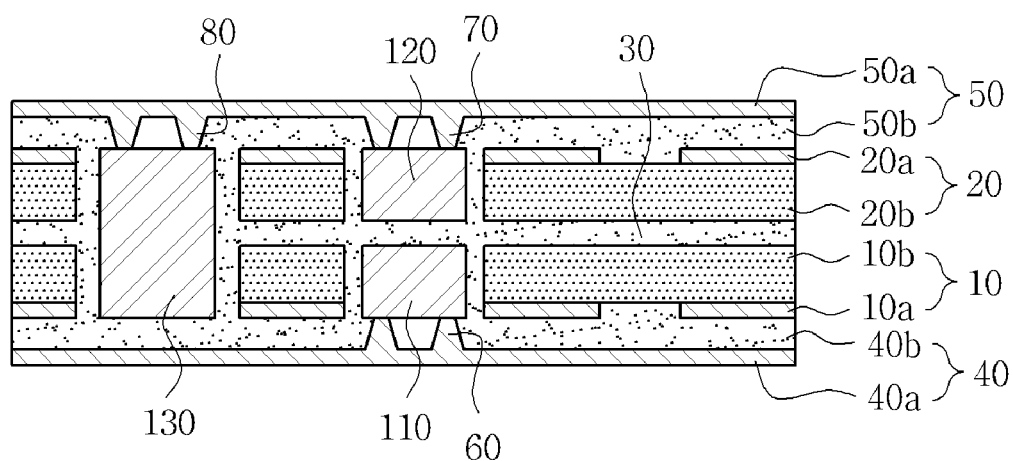

Next, as shown in FIG. 9, a first via 60 is formed to electrically connect the first outer circuit layer 40a with the first device 110, a second via 70 is formed to electrically connect the second outer circuit layer 50a with the second device 120, and a third via 80 is formed to electrically connect the second outer circuit layer 50a with the third device 130.

Specifically, a photosensitive resist (not shown) is applied on an outer circuit layer (including the first outer circuit layer and the second outer circuit layer), and an opening that exposes a via forming portion is formed. As such, the opening may be formed by subjecting the photosensitive resist other than the via forming portion to photo-exposure, and then removing the unexposed photosensitive resist applied on the via forming portion using a developer. An example of the photosensitive resist may include a dry film or a liquid photoresist. Thereafter, the portion of the outer circuit layer exposed by the opening is removed from the outer circuit layer (including the first outer circuit layer and the second outer circuit layer). Thereafter, the photosensitive resist is removed using a stripper such as NaOH or KOH. Thereafter, the insulating layer (including the first insulating layer and the second insulating layer) of the via forming portion is processed thus forming a via hole. The via hole may be processed using a CNC (Computer Numerical Control) drill, $CO_2$ or Yag laser drill. Thereafter, the via hole is plated thus forming a via 60, 70, 80.

On the other hand, the first base substrate 10 and the second base substrate 20 may be formed of a metal layer. In the case where an embedded PCB is manufactured using base substrates made of a metal layer, the manufacturing process thereof may be the same as the one mentioned above.

As described hereinbefore, the present invention provides an embedded PCB and a method of manufacturing the same. According to the present invention, electronic devices having different thicknesses can be embedded together, thus achieving highly dense electronic devices.

As such, when the electronic devices having considerably different thicknesses are embedded, two electronic devices which are comparatively thinner can be embedded in a perpendicular direction, thus reducing an embedding area and suppressing warping of the PCB.

Also, according to the present invention, an insulating member the thickness of which is variably adjusted is interposed between base substrates, so that spaces between the electronic devices are completely filled therewith, thus solving the problem of void defects in the PCB, resulting in reliable PCBs.

Also, according to the present invention, in the case where the base substrate includes a core made of metal, resistance to stress applied to the PCB can become stronger, thus suppressing warping of the PCB.

Although the embodiments of the present invention regarding the embedded PCB and the method of manufacturing the same have been disclosed for illustrative purposes, those skilled in the art will appreciate that a variety of different modifications, additions and substitutions are possible, without departing from the scope and spirit of the invention as disclosed in the accompanying claims. Accordingly, such modifications, additions and substitutions should also be understood as falling within the scope of the present invention.

What is claimed is:

1. An embedded printed circuit board, comprising:
   a first base substrate having a first device embedded therein;
   a second base substrate having a second device embedded therein;
   an insulating member without a circuit pattern formed between one surface of the first base substrate and one surface of the second base substrate;
   a third device which is embedded to pass through the first base substrate, the second base substrate and the insulating member and is thicker than the first device and the second device;
   a first copper clad laminate formed on the other surface of the first base substrate and including a first insulating layer and a first outer circuit layer formed on an outer surface of the first insulating layer; and
   a second copper clad laminate formed on the other surface of the second base substrate and including a second insulating layer and a second outer circuit layer formed on an outer surface of the second insulating layer;
   wherein the first device and the second device are formed in a line in a direction perpendicular to the insulating member's plane and in a same cavity, and wherein the thickness of the third device is thicker than a sum of the thicknesses of the first device and the second device.

2. The embedded printed circuit board as set forth in claim 1, further comprising:

a first via for electrically connecting the first outer circuit layer with the first device;

a second via for electrically connecting the second outer circuit layer with the second device; and a third via for electrically connecting the second outer circuit layer with the third device.

3. The embedded printed circuit board as set forth in claim 1, wherein the first base substrate and the second base substrate are formed of a metal layer.

4. The embedded printed circuit board as set forth in claim 1, wherein the first base substrate comprises a first core layer and a first inner circuit layer formed on an outer surface of the first core layer, and the second base substrate comprises a second core layer and a second inner circuit layer formed on an outer surface of the second core layer.

* * * * *